(12) United States Patent
Hawke et al.

(10) Patent No.: US 9,656,858 B2
(45) Date of Patent: May 23, 2017

(54) REACTIVE ION ETCHING

(71) Applicant: Atlantic Inertial Systems Limited, Plymouth (GB)

(72) Inventors: Tracey Hawke, Bristol (GB); Mark Venables, Bristol (GB); Ian Sturland, Bristol (GB); Rebecka Eley, Bristol (GB)

(73) Assignee: ATLANTIC INERTIAL SYSTEMS LIMITED, Plymouth (GB)

( * ) Notice: Subject to any disclaimer, the term of this patent is extended or adjusted under 35 U.S.C. 154(b) by 0 days.

(21) Appl. No.: 14/336,477

(22) Filed: Jul. 21, 2014

(65) Prior Publication Data
US 2015/0021745 A1 Jan. 22, 2015

(30) Foreign Application Priority Data

Jul. 22, 2013 (GB) .................................. 1313042.2

(51) Int. Cl.
*H01L 21/311* (2006.01)
*H01L 21/302* (2006.01)
(Continued)

(52) U.S. Cl.
CPC ........ B81C 1/00531 (2013.01); B81B 3/0064 (2013.01); B81C 1/00388 (2013.01);
(Continued)

(58) Field of Classification Search
CPC ........... H01L 21/3065; H01L 21/30655; H01L 21/308; B81C 1/619; B81C 1/00531; B81C 1/00388; B81C 1/00619; B81C 2201/0112
(Continued)

(56) References Cited

U.S. PATENT DOCUMENTS 7,105,098 B1   9/2006   Shul et al.
7,786,017 B1   8/2010   Morgenfeld et al.
(Continued)

FOREIGN PATENT DOCUMENTS

CN   102616733   8/2012

OTHER PUBLICATIONS

European Search Report dated Oct. 1, 2014 in European Application No. 14177859.7.
(Continued)

*Primary Examiner* — Fernando L Toledo
*Assistant Examiner* — Aaron Gray
(74) *Attorney, Agent, or Firm* — Snell & Wilmer, L.L.P.

(57) ABSTRACT

A method of reactive ion etching a substrate 46 to form at least a first and a second etched feature (42, 44) is disclosed. The first etched feature (42) has a greater aspect ratio (depth:width) than the second etched feature (44). In a first etching stage the substrate (46) is etched so as to etch only said first feature (42) to a predetermined depth. Thereafter in a second etching stage, the substrate (46) is etched so as to etch both said first and said second features (42, 44) to a respective depth. A mask (40) may be applied to define apertures corresponding in shape to the features (42, 44). The region of the substrate (46) in which the second etched feature (44) is to be produced is selectively masked with a second maskant (50) during the first etching stage, The second maskant (50) is then removed prior to the second etching stage.

8 Claims, 4 Drawing Sheets

(51) Int. Cl.
*H01L 21/461* (2006.01)
*H01L 29/06* (2006.01)
*B81C 1/00* (2006.01)
*B81B 3/00* (2006.01)
*H01L 21/3065* (2006.01)
*H01L 21/308* (2006.01)

(52) U.S. Cl.
CPC ........ *B81C 1/00619* (2013.01); *H01L 21/308* (2013.01); *H01L 21/3065* (2013.01); *B81B 2201/033* (2013.01); *B81B 2203/033* (2013.01); *B81C 2201/0112* (2013.01)

(58) Field of Classification Search
USPC .......... 257/622, E21.218, E21.231, E21.232, 257/E21.233; 438/700, 706, 710, 712
See application file for complete search history.

(56) References Cited

U.S. PATENT DOCUMENTS

| | | | |
|---|---|---|---|
| 2004/0232502 A1* | 11/2004 | Hsieh et al. | 257/415 |
| 2005/0054153 A1* | 3/2005 | Asami | B81C 1/00619 438/202 |
| 2008/0070402 A1* | 3/2008 | Kotani et al. | 438/620 |
| 2012/0083128 A1* | 4/2012 | Hung | H01L 21/3065 438/711 |
| 2015/0091140 A1* | 4/2015 | Wen | B81C 1/00396 257/622 |

OTHER PUBLICATIONS

EPO; Examination Report dated Jun. 6, 2016 in EP Application No. 14 177 859.7.

* cited by examiner

REACTIVE ION ETCHING

The present application claims priority from Great Britain Application No: 1313042.2 filed on Jul. 22, 2013.

BACKGROUND

This disclosure relates to methods of reactive ion etching and in particular, but not exclusively, to improvements in the Deep Reactive on Etching (DRIE) process and similar processes.

In the field of Micro Electrical Mechanical Systems (MEMS), anisotropic etching of silicon and other substrates can be achieved using a DRIE method referred to commonly as the "Bosch Process". This process is described for example in U.S. Pat. No. 5,501,893 and involves alternating between a silicon plasma etching step (typically using $SF_6$) and a passivation step including a fluoropolymer (typically $C_4F_8$). During the passivation step, the fluoropolymer is deposited on all of the sample surfaces, During the etching step, ion assisted plasma etching is used preferentially to remove the fluoropolymer from the bottom of an etched feature, whilst still retaining its protection on the side walls. The exposed silicon at the bottom of the feature can then be etched, and the process be repeated until the desired depth is reached.

Inherent to DRIE is a phenomenon referred to as Aspect Ratio Dependant Etching (ARDE), in which the etch rate is inversely proportional to the aspect ratio, defined herein as the ratio of depth to width of the formed feature. This leads to the observation known as RIE lag, whereby smaller features etched at the same time are shallower than larger features. When etching a variety of feature geometries down to an etch-stop layer, it becomes necessary to over etch the wider features, This can lead to effects such as "footing" (or notching), as well as a loss of dimensional control.

This is of particular concern in the production of MEMS sensors such as accelerometers. An example of a MEMS accelerometer is disclosed in WO 2012/076837 A1. In this device, a silicon wafer is micromachined to provide a movable proof mass having a plurality of fingers which interdigitate with fingers of a part of the wafer which will, in use, be fixed. The gap between one side of any given proof mass finger and the adjacent fixed finger is different from the gap between the other side of the proof mass finger and its adjacent fixed finger. As the proof mass moves, the gap between the proof mass fingers and the fixed fingers varies, which leads to a change in capacitance between the fingers. This can be measured and processed to calculate an acceleration. In closed loop systems, the variation in gap size produces an electrostatic force which counters the movement of the proof mass. In such systems, it is particularly desirable to have a large ratio of the width of the wider gap (for example 15 microns) to the width of the narrower gap (for example 5 microns). Relatively large ratios can be produced using existing DRIE processes, but at the expense of enlarged finger pitch, making the device larger to provide a given electrostatic force. If the device is made smaller, the above identified problems of footing, notching and loss of dimensional control may occur.

Current proposals to compensate for lag involve optimising the etch and passivation step and parameters, mainly by lowering pressure values. However, current techniques for compensation of DRIE lag are at the expense of reduced etch rates.

SUMMARY

There is disclosed herein a method of reactive on etching a substrate to form at least a first and a second etched feature, wherein the first etched feature has a greater aspect ratio (depth:width) than the second etched feature, the method comprising the steps of:

in a first etching stage, etching said substrate so as to etch only the first feature to a predetermined depth; and thereafter in a second etching stage etching the substrate so as to etch both the first and said second features to a respective depth.

The provision of first and second etching stages whereby selected high aspect ratio features are etched for a longer period of time relative to low aspect ratio features may lead to reduced RIE Lag.

The method may comprise applying a masking material to a surface of the substrate to define first and second apertures corresponding to the desired shape of the first and second features. The first etching stage may include selectively etching the substrate only through the first aperture to etch the first etched feature to a predetermined depth. Thereafter the second etching stage may include etching the substrate through both the apertures thereby to etch both the first and second features to a respective depth.

Each feature may be etched to substantially the same depth, or to selected different depths.

Where masking is used, the first etching stage may include the step of occluding the second aperture and exposing the substrate to a reactive etching process, whereby etching occurs only through the first aperture in the first etching stage.

The step of occluding may include applying a further masking material to cover the second aperture, and later removing the further masking material from the second aperture prior to the second stage etching process.

In one implementation, the further masking material may have a high selectivity relative to the substrate material such that it may be substantially unaffected by the first stage etching process. Alternatively, in another implementation, the further masking material may be less selective and more susceptible to said etching process, so as progressively to thin and then to expose the second aperture whereupon the second stage etching occurs.

Although the above technique may be used in different etching processes, it has particular application to anisotropic reactive on processes, comprising alternate etching and passivation steps.

The disclosure also extends to a substrate etched by the above Techniques.

In embodiments, the ratio of the larger aspect ratio to the smaller aspect ratio may be between 2.0 and 3.5, for example 2.25 to 3.25, for example 2.5 to 3.0, for example 2.6 to 2.7. Thus with features of equal depth, (as will typically be the case) the relative widths of the wider feature and narrower feature will have these values.

The ratio of the variation in width of the second feature from its top to its bottom to the depth of the substrate may be less than or equal to 0.015, for example less or equal to 0.01. The minimum width will generally be at the top of the feature and the maximum width at the bottom of the feature with a generally uniform increase in width from top to bottom. Thus for example in a substrate which is 100 microns deep, the maximum difference in width from top to bottom may be less than 1.5 microns (corresponding to a ratio of 0.015), or less than 1.0 microns (corresponding to a ratio of 0.010). Of course lower ratios, for example less than or equal to 0.009, 0.008 or 0.007 may be possible.

The features may be of any desired shape. Typically, however, the features will be in the forms of slots, more particularly straight slots, formed in the substrate.

The features may extend completely through the substrate or to a predetermined depth therein.

In addition, while the technique can be applied to the manufacture of any device, it has particular application to the production of MEMS sensors such as accelerometers.

This disclosure therefore also extends to encompass an MEMS sensor produced by the above technique.

The sensor may comprise a plurality of interdigitated fingers with gaps or slots formed by the above process defined between adjacent fingers. The depth of the gaps may be the same, but the width of the gaps vary such that the aspect ratio of the respective gaps differs. The above ranges for the relative aspect ratios of the gaps and the ratio of maximum to minimum widths of the larger aspect ratio gap may apply. Typically, the gaps will extend completely through the substrate and the substrate be of uniform depth.

There is also therefore disclosed herein in broad terms a MEMS sensor comprising a substrate having first and second features etched therein, wherein the first etched feature has a greater aspect ratio (depth:width) than the second etched feature, and wherein the ratio of the variation in width of the second feature from its top to its bottom to the depth of the substrate is less than or equal to 0.015, for example less or equal to 0.01.

Thus for example in a substrate which is 100 microns deep, the variation in width of the feature may be of less than 1.5 microns, for example less than 1.0 microns. There may be a generally uniform increase in width from top to bottom.

The ratio of the larger aspect ratio to the smaller aspect ratio may be between 2.0 and 3.5, for example 2.25 to 3.25, for example 2.5 to 3.0, for example 2.6 to 2.7.

BRIEF DESCRIPTION OF THE DRAWINGS

Some embodiments of this disclosure will now be described by way of example only with reference to the accompanying drawings in which.

DETAILED DESCRIPTION

Figure 1:
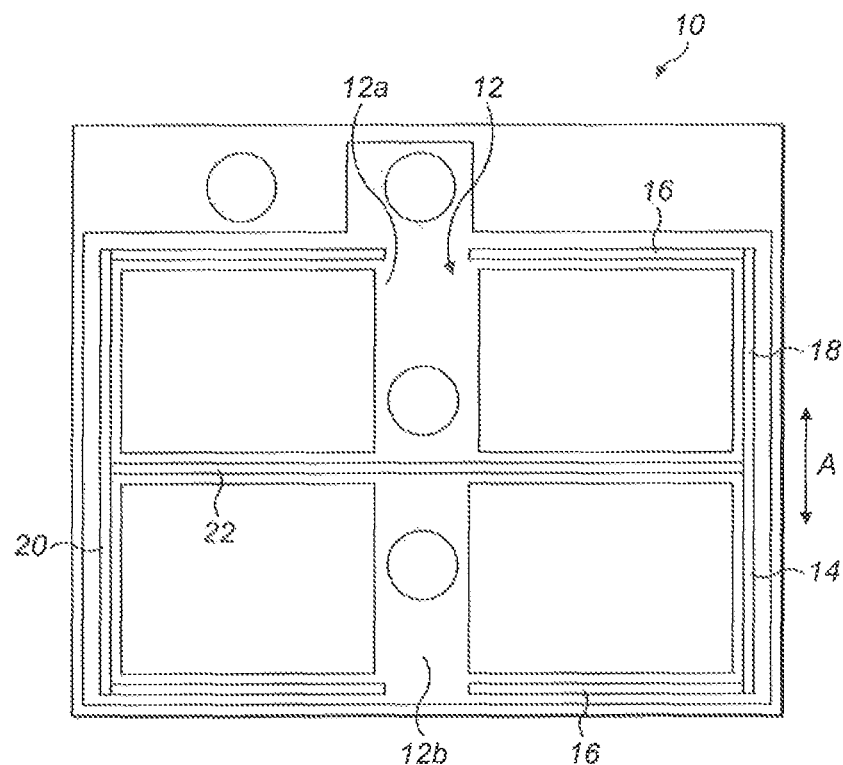
FIG. 1 illustrates a MEMS accelerometer.

As discussed above, etching of silicon and other substrates can be achieved using a DRIE method referred to commonly as the "Bosch Process". This process is described in U.S. Pat. No. 5,501,893. In a typical process, a mask of material resistant to the reactive on etching process, for example SiO2 or SiN is applied to the substrate (typically of silicon) being etched with the mask having a pattern of apertures corresponding to the features to be etched in the substrate, such as holes, trenches etc. The mask may be applied by a photolithographic method. The manufacturing process involves alternating separate etching and deposition steps. The etch step is carried out using a plasma and a suitable gaseous etchant such as, for example, Sulphur Hexafluoride ($SF_6$).

During the deposition step, a passivation gas such as for example octaflurocyclobutane ($C_4F_8$) is used. During the deposition step, the fluoropolymer is deposited on all of the exposed sample surfaces. During the etch step, ion assisted etching is used preferentially to remove fluoropolymer from the bottom of an etched feature whilst still retaining its protection on the sidewalls. The exposed silicon can then be etched and the etching and deposition step are repeated until the desired depth is reached. This technique is well known in the art and needs no further elucidation here.

It is also well known that the etch rate is inversely proportional to the aspect ratio of the formed feature. This effect is known as Aspect Ratio Dependant Etching (ARDE). This leads to the observation known as RIE lag in which smaller features will be created shallower than lamer features. This arises because ion bombardment and gas transport are reduced significantly at the bottom of high-aspect ratio features causing the etch rate to drop as the features become deeper. In the DRIE process, at the start of each etch step, the passivation layer at the bottom of the trench or other feature is physically etched by ion bombardment. However, as the trench becomes deeper, it becomes more likely that these ions will be deflected from their path by collisions. Fewer ions reaching the bottom of deep features slows the removal of the passivation layer which consequently reduces the length of time that the silicon is exposed to the etchant gases later in the etch step. Additionally gas transport is significantly reduced in narrow trenches. It becomes very difficult for the etchant gases to flow to the bottom of the feature and to react with the silicon and to remove the waste products from the reaction.

The practical effect of this is that, in order to get all widths of feature to penetrate to the required depth (such as to an etch stop layer) the largest features would experience a considerable over etch. The problem here is though that, when the stop layer is reached, the reactive ions (e.g. fluorine ions) in the etchant gas will no longer be consumed at the etch front (because there is now no etch front), and the unreacted fluorine ions will make their way out of the trench, with a likelihood of incidence with the side wall. This increase to the spread in ion angular distribution means that, by the time the stop layer is reached on the smaller features, the openings of the wider structures will have received significant sidewall ion bombardment which will create pinholes in the deposition coverage. The pinholes in the deposition are areas where the unreacted fluorine ions will begin to isotropically erode the sidewall, resulting in damage at the top of the trench. This can cause an undercut which can affect the metrology and performance of the device.

Figure 2:
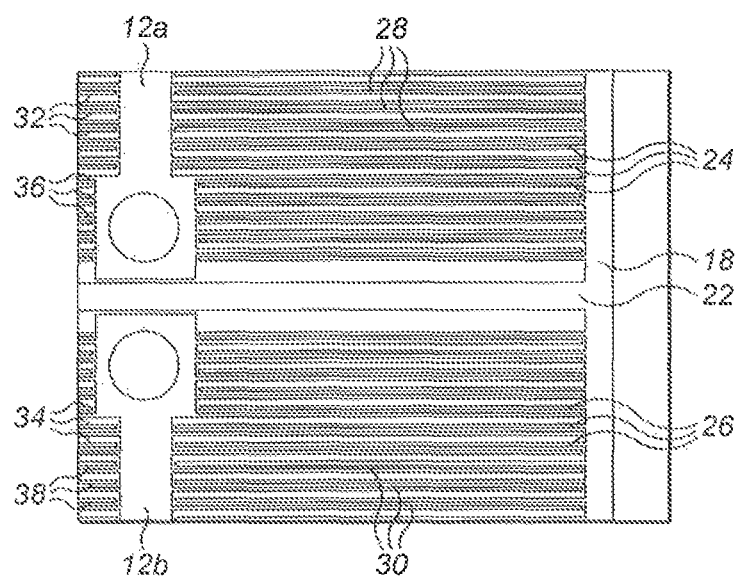
FIG. 2 shows a detail of the accelerometer of FIG. 1; which may benefit from the disclosed processes.

The DRIE process described above may be used to manufacture MEMS such as sensors, for example for accelerometers. FIGS. 1 and 2 show such a device, which is merely exemplary and is not intended to limit the scope of the disclosure.

FIG. 1 shows an accelerometer of the kind described in WO 2012/076837 A1. The accelerometer 10 comprises a support 12 to which a proof mass 14 is movably mounted by means of a series of mounting legs 16. The proof mass 14, legs 16 and support 12 are formed integrally with one another and are substantially coplanar, being fabricated by DRIE etching of a wafer, for example a silicon wafer.

The proof mass 14 is made up of a first mass element 18, connected to the support 12 by a pair of the mounting legs 16, and a second mass element 20 connected to the support 12 by another pair of the mounting legs 16. A cross brace 22 interconnects the first and second mass elements 18, 20 in such a manner as to ensure that they more together, in unison, in use and so act as a single mass.

As shown in FIG. 2, the first mass element 18 carries upper and lower groups 24, 26 of movable capacitor fingers, each finger extending substantially parallel to the mounting legs 16 and so substantially perpendicular to the direction A in which the proof mass 14 is able to move relative to the support 12. The support 12 has associated therewith a first pair of upper and lower groups 28, 30 of fixed capacitor fingers. The fingers of the upper group 28 are interdigitated with those of the upper group 24, and the fingers of the lower group 30 are interdigitated with those of the lower group 26. Similarly, the second mass element 20 is provided with upper and lower groups 32, 34 of movable capacitor fingers, interdigitated with a second pair of upper and lower groups 36, 38 of fixed capacitor fingers associated with the support 12. The first and second upper groups 28, 36 are associated with the upper part 12a of the support 12 and the first and second lower groups 30, 38 are associated with the lower pan 12b of the support 12.

As best shown in FIG. 2, the fingers of each interdigitated pair of groups are not equally spaced. in each case, the fixed fingers of each of the groups 28, 30, 36, 38 associated with the support 12 lie closer to the adjacent moveable finger nearest the brace bar 22 than it does to the adjacent movable finger more remote from the brace bar 22, when the proof mass 14 occupies its central, rest position. That is, the silicon wafer is etched such that the gaps between adjacent movable fingers and fixed fingers are different. As the depth of each gap is the same, the aspect ratio of the gaps is different.

The wafer from which these components are integrally formed is typically sandwiched between a pair of glass or other suitable material substrates. These substrates may be etched to provide relief in areas where movement of the proof mass 14 is required. Typically the silicon wafer will be attached to one of the substrates prior to its etching, for support. Further details of the accelerometer's general construction can be obtained from WO 2012/076837 A1.

The ratio of the aspect ratios of the gaps between the fingers may be typically be in the range 1:1.5 to 1:1.8. Thus the ratio of the widths of the gaps (which have the same depth) is typically also 1:1.5 to 1:8. It would be desirable to increase this ratio, for example for size purposes, but in trying to achieve this, using DRIE, the aforementioned problem of DRIE lag occurs.

In the methods disclosed below, high aspect ratio features (e.g. the narrower gaps between the fingers described above) are etched for longer than low aspect ratio features (e.g. the wider gaps between the fingers described above). The method incorporates an extra masking step to keep the wider features covered and isolated for the etching process whilst the narrower ones receive an initial "head start" of etching. Once the narrower features have received a sufficient head start or lead, the extra mask can be removed, and both feature sizes can be etched until they both reach the required depth or depths or break through simultaneously.

In a first embodiment, having applied the conventional masking, a substantially inert second mask material is applied over the mask areas designed to form low aspect ratio (i.e. wider) features. The second mask material to occludes these, leaving just the high aspect ratio (i.e. narrower) features on the substrate exposed to the alternating etch and deposition steps until the required head start has been achieved. The second mask material is then removed and both sets of features then etched together.

In a second embodiment, the low aspect ratio (i.e. wider) features are covered by a second mask material that is gradually etched away by the etching process but delays exposure of the wafer substrate in the region of the high aspect ratio (i.e. narrower) features to the etching process until after the required head start has been achieved. The second mask material thus provides a sacrificial mask that defers exposure of the underlying substance material until the sacrificial material has been removed. The thickness of the sacrificial mask is selected having regard to the reactivity/etch rate of the sacrificial material and the delay required.

Referring now therefore to FIG. 3, in the first embodiment, a mask 40 defining a pattern of features 42, 44 to be etched (e.g. the fingers described above) on a silicon wafer substrate 46 is applied to the substrate surface, for example by photolithography. In effect, openings 43, 45 are defined by the mask 40 to provide access to the surface of the substrate 46. The silicon wafer substrate 46 is mounted on a base wafer 48 for support. As discussed above, the base wafer may be relieved in areas to allow for movement of etched features, if so desired. The silicon wafer substrate 46 illustrated is of uniform thickness, for example 100 microns, although it can have a variable thickness.

Figure 3A:
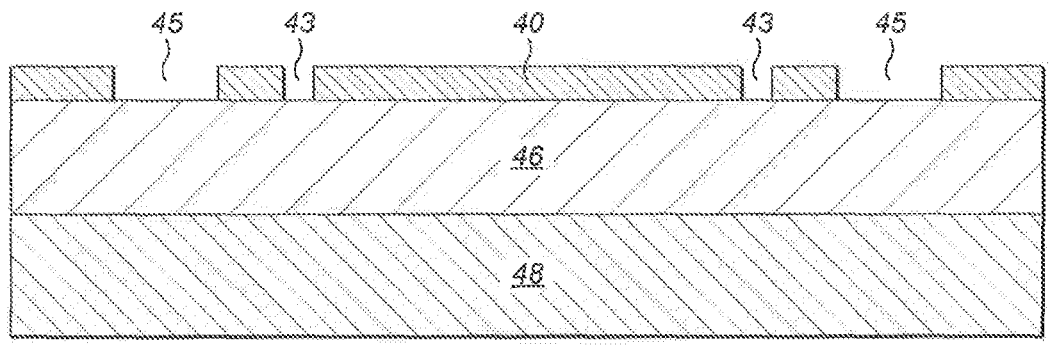
FIGS. 3(a) to (f) are sequential diagrams for explaining a first example of a RIE process in accordance with this disclosure.
Figure 3B:
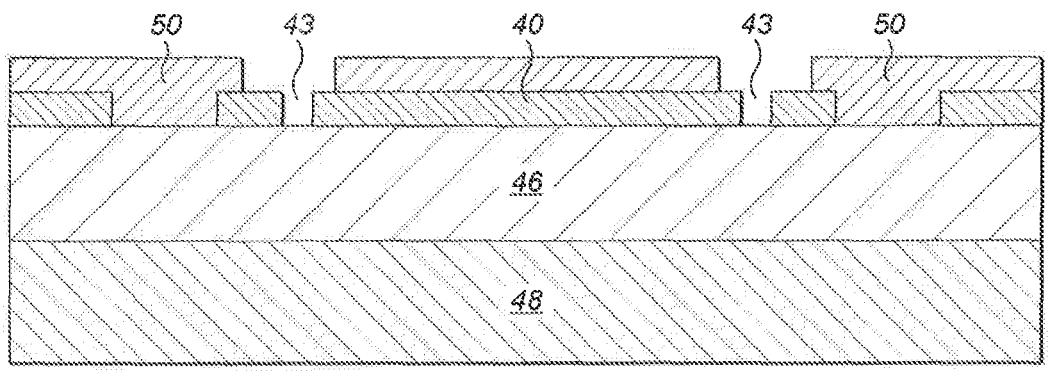
Figure 3C:
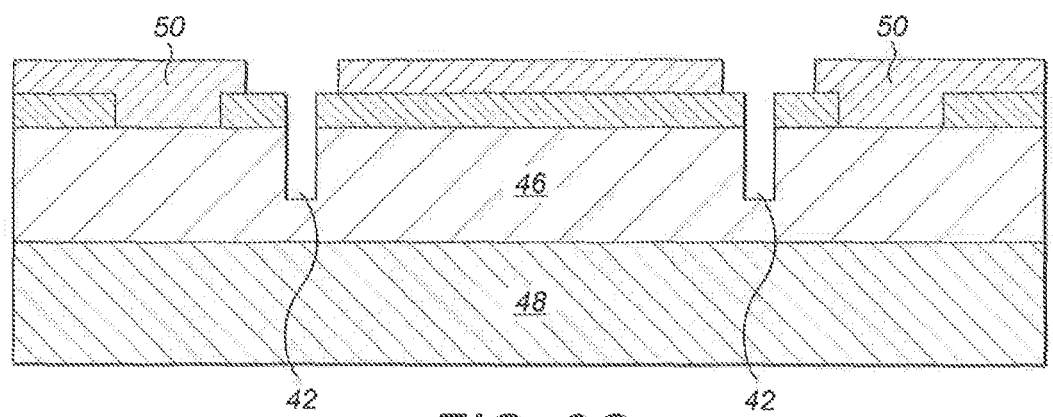
Figure 3D:
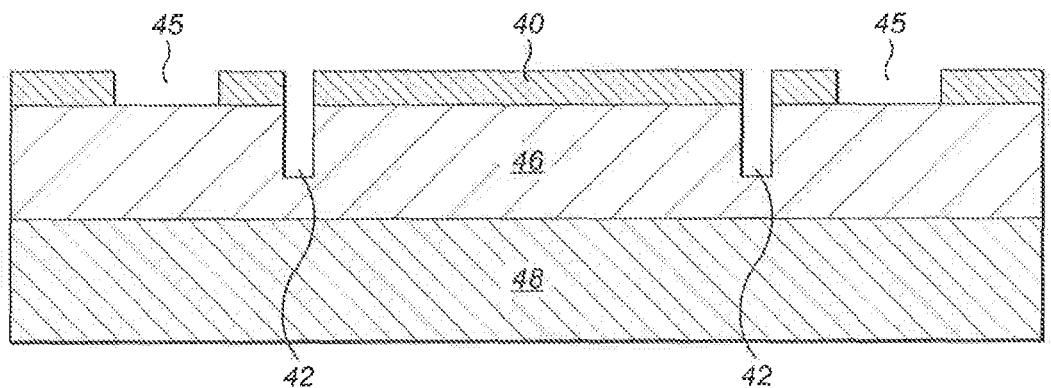
Figure 3E:
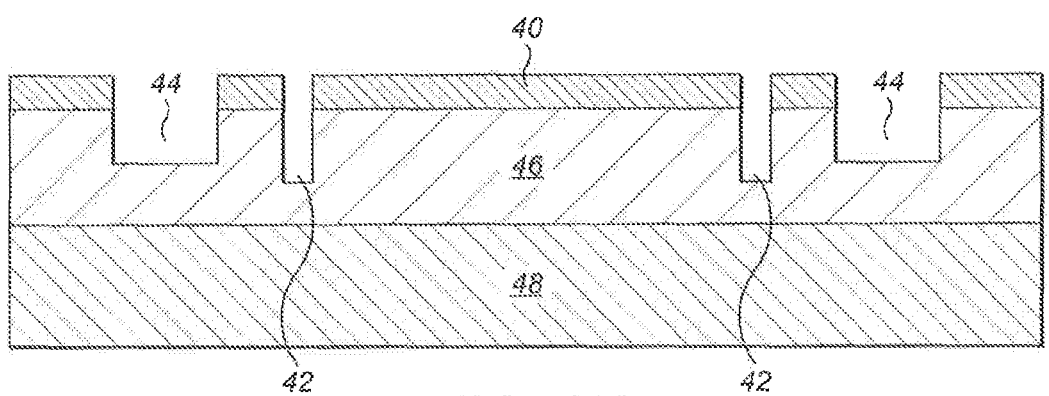
Figure 3F:
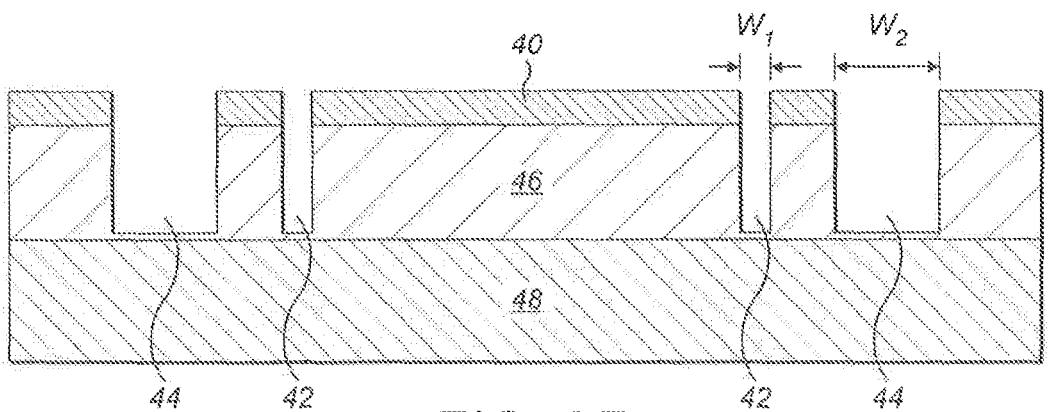

With reference to FIG. 3c . features 42 have an aspect ratio of $d_1:w_1$ and features 44 have an aspect ratio of $d_2:w_2$. In the present case, d1 is equal to d2, although that not need necessarily be so. $d_1$ is smaller than $d_2$ whereby the features 42 have a larger aspect ratio than the features 44.

The features 44 that, when formed, will have low aspect ratios are then masked by a second layer of masking material 50 which occludes or covers the wider openings 45 in the mask 44 but not the narrower openings 43 (FIG. 3(b)). A suitable second making material is a photoresist material which may for example be applied by a spin-on process. It will be understood that the reference to high and low aspect ratios in this application is relative, and the threshold level between high and low may for example be selected on the basis of empirical observation of a trial etch.

During a first stage of etching, the alternating etch and deposition steps are applied so that the narrow features 42 are etched to a required head start depth. The required depth for a particular process may be determined empirically based on theoretical etch rates, Once the required head start depth has been achieved (FIG. 3c ), the second masking material 50 is removed by any suitable process, for example by a suitable solvent, (FIG. 3(d)) so that the wider openings 45 in the mask 40 are once more exposed, allowing for the etching of the wider features 44 of lower aspect ratio. The etching and alternate deposition steps are then continued as a second etching stage, with the wider features etching at a faster rate (FIG. 3(e), until both features break through to the underlying base wafer 48 broadly at the same time (FIG. 3(f)). The etching process parameters for the second etching stage will typically be the same as those for the first etching stage.

Figure 4A:
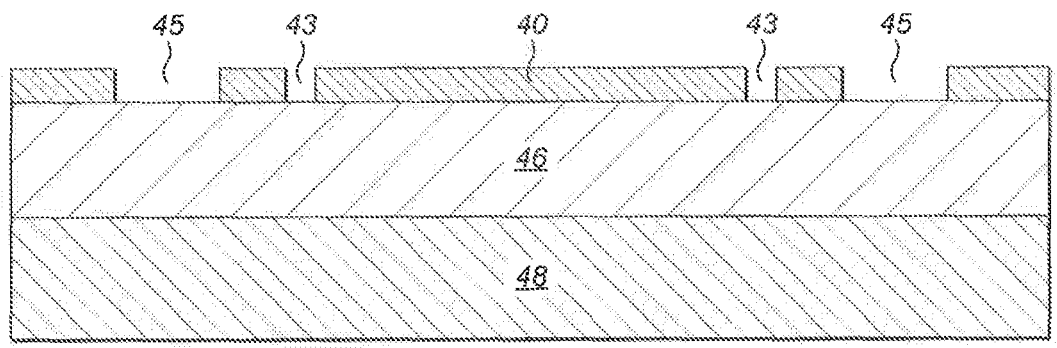
FIGS. 4(a) to (c) are sequential diagrams for explaining a second example of a RIE process in accordance with this disclosure.
Figure 4B:
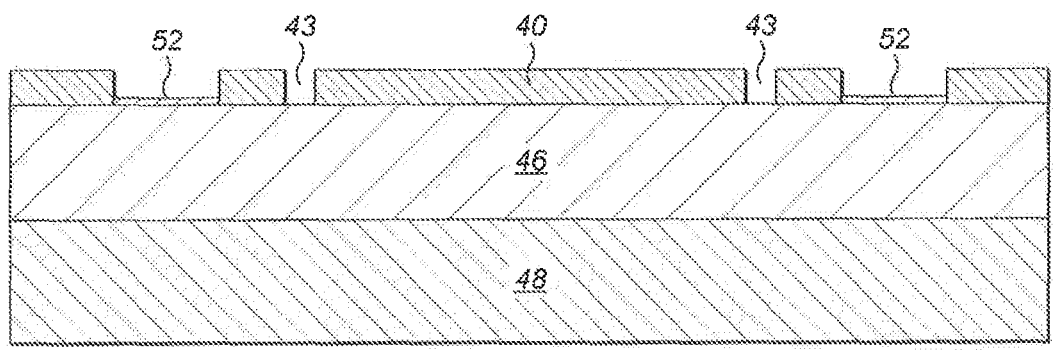
Figure 4C:
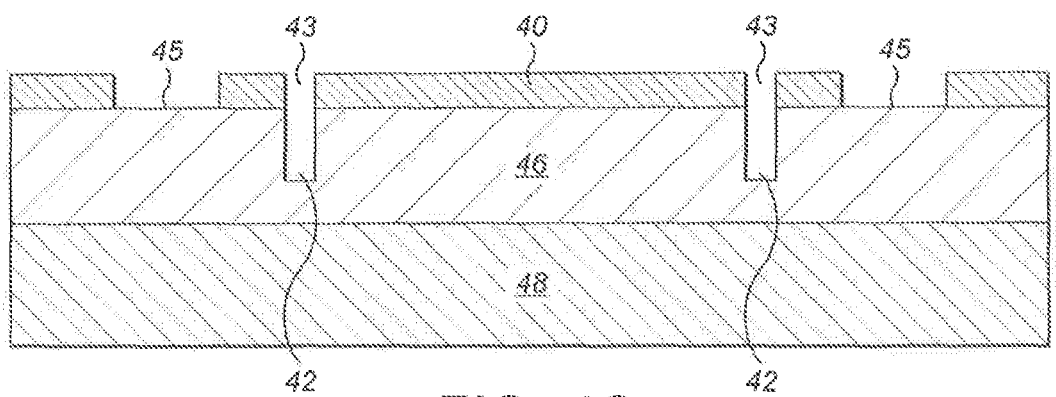

Referring now to 4(a) to (c), in the second embodiment, a first layer of masking material 40 is applied as before to define narrow and wide openings 43, 45, and a second masking material 52 applied to at least partially occlude or cover the wide openings 45 such that the surface of the substrate 46 under the opening 45 is not exposed. However, in this embodiment, the second mask material 52 is a sacrificial mask material of material and thickness selected so that, as with the previous embodiment, during a first etching stage, just the narrow features 42 are etched into the substrate 46 (FIG. 4c ). The sacrificial mask may be a standard photo mask polymer. During this first stage, the masking material 52 covering the wide feature 44 is etched away to thin and then eventually to expose the underlying substrate (FIG. 3(c)), so that both features can therefore be etched as before, at their differing rates, so that they break through the bottom of the silicon wafer substrate 46 (or reach an appropriate depth) at broadly the same time. The required thickness of the second mask material 52 may be determined empirically from test etches and will depend upon the material used and the etching parameters. This embodiment may obviate the need to stop the process between the first and second etching stages, allowing a continuous etching process to be employed.

In both the described methods, therefore, the effect of RIE lag is reduced or eliminated by first etching only the narrow (high aspect ratio) feature into the substrate. The region of the substrate in which the wider (low aspect ratio) feature is to be produced is masked to prevent premature etching of that feature. Only after the mask has been removed, or been etched away will etching of the wider (low aspect ratio) feature begin.

Using this technique, therefore, the ratios of feature aspect ratios can be increased (for example to the figures discussed above) without sacrificing the depthwise uniformity of the feature with the lower aspect ratio.

In the context of the MEMS sensor e.g. accelerometer described above, the use of the described method may allow a relatively high ratio of wide to narrow gaps dimensions to be achieved without increasing the size of the sensor. Thus for example where a substrate of constant thickness is used, the wider slots may typically be made up to 3 times or more wider than the narrower slots while still maintaining a substantially uniform depthwise profile of the wider slot.

In a particular embodiment, in a 100 micron deep substrate, the narrower gap may be approximately 6 microns wide at its top and the wider gap approximately 16 microns wide at its top. The ratio of aspect ratios is therefore 2.66 in this example.

In the same example, the variation in the width of the narrower gap may be less than 1 micron. For example the narrower gap may be 6 microns at its top and 7 microns at its bottom.

For the purposes of this disclosure, the width of the feature used in ascertaining the aspect ratio of the feature is the minimum width of the feature, in particular the width at the top of the feature.

It will be understood that while the method has been described above in relation to the production of a MEMS sensor, the disclosure is not limited to that application and will find use for example in the manufacture of other MEMS components.

The invention claimed is:

1. A method of reactive ion etching a substrate to form at least a first and a second etched feature, wherein the first etched feature has a greater aspect ratio (depth:width) than said second etched feature, the method comprising the steps of:
   in a first etching stage etching said substrate so as to etch only said first feature to a predetermined depth, wherein a ratio of a variation in said width of said second etched feature from a top of said second etched feature to a bottom of said second etched feature is at least one of less than or equal to 0.015, and wherein said first etched feature comprises a narrower width than said second etched feature;
   thereafter in a second etching stage etching said substrate so as to etch both said first and said second features to a respective depth;
   applying a masking material to a surface of the substrate to define first and second apertures corresponding to the shape of said first and second etched features;
   in said first etching stage selectively etching said substrate only through said first aperture to etch the first etched feature to the predetermined depth;
   thereafter in said second etching stage, etching said substrate through both said apertures thereby to etch both said first and second features to the respective depth;
   wherein said first etching stage includes the step of occluding said second aperture and exposing said masked substrate to a reactive etching process, whereby etching occurs only through said first aperture; and
   wherein said step of occluding includes selectively applying a second masking material directly on the masking material to cover said second aperture while said first aperture remains exposed, and removing said second masking material from said second aperture after said first stage etching process and prior to said second stage etching process.

2. A method according to claim 1, wherein each feature is etched to substantially the same depth.

3. A method according to claim 2, wherein each feature is etched through the entire depth of the substrate.

4. A method according to claim 1, wherein said second masking material is responsive to a third etching process progressively to thin and then to expose said second aperture, after which said second stage etching occurs.

5. A method according to claim 1, wherein said reactive ion etching process is an anisotropic reactive ion process, comprising alternate etching and passivation steps.

6. A method according to claim 1, wherein said first and second features are slots formed in said substrate which define adjacent, interdigitating fingers with different spacing between adjacent fingers.

7. A method according to claim 1, wherein the substrate is a wafer for a MEMS sensor.

8. A MEMS sensor comprising a substrate etched by the method of claim 1.

* * * * *